Figure 1:
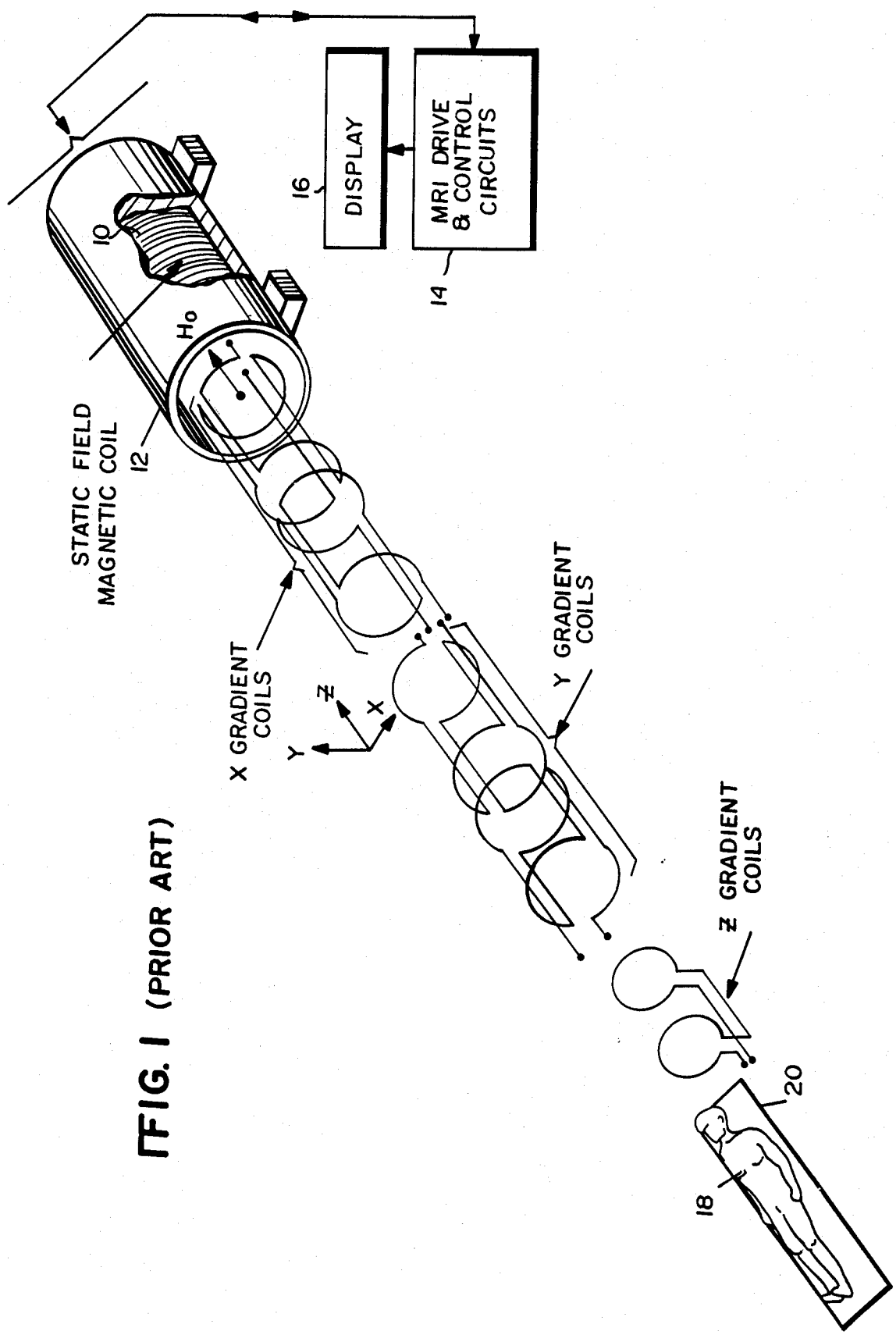

United States Patent [19]

Crooks et al.

[11] Patent Number: 4,820,988

[45] Date of Patent: Apr. 11, 1989

[54] MAGNETIC GRADIENT COIL SET FOR NUCLEAR MAGNETIC RESONACE SYSTEM HAVING SUBSTANTIALLY DIFFERENT COIL-PATIENT SPACINGS

[75] Inventors: Lawrence E. Crooks, Richmond; Joseph W. Carlson, San Francisco, both of Calif.

[73] Assignee: The Regents of the University of California, Berkeley, Calif.

[21] Appl. No.: 105,738

[22] Filed: Oct. 7, 1987

[51] Int. Cl.⁴ .............................................. G01R 33/20
[52] U.S. Cl. .................................... 324/318; 324/322
[58] Field of Search ............... 324/318, 319, 320, 322, 324/309; 335/299, 300

[56] References Cited

U.S. PATENT DOCUMENTS

| 3,569,823 | 3/1971 | Golay | 324/318 |
| 3,622,869 | 11/1971 | Golay | 324/318 |
| 4,456,881 | 6/1984 | Compton | 324/319 |
| 4,642,569 | 2/1987 | Hayes et al. | 324/318 |
| 4,712,067 | 12/1987 | Roschmann et al. | 324/318 |
| 4,728,895 | 3/1988 | Briguet et al. | 324/318 |

OTHER PUBLICATIONS

Magnetic Resonance in Medicine, 1, 44-65, (1984), "Magnet Field Profiling: Analysis and Correcting Coil Design" by Romeo and Hoult.

Primary Examiner—Steward J. Levy
Assistant Examiner—Louis M. Arana
Attorney, Agent, or Firm—Nixon & Vanderhye

[57] ABSTRACT

In a gradient coil set for a magnetic resonance system, the y gradient coils are located substantially closer to the patient than are the x and z gradient coils. As a result, one may design the y gradient coils to produce a stronger y gradient, to have reduced inductance or otherwise better tailor the magnetic/electrical properties of the gradient coil set for MRI imaging sequences. In the exemplary embodiment, at least portions of the y gradient coils have a first spacing from the z-axis while the x and z gradient coils have a second substantially larger spacing from the z-axis. Furthermore, while the x and z gradient coils are centered about the z-axis in the patient access space, alternate sides of the y gradient coil set are centered about respectively off-set centers vertically displaced from the z-axis center of the patient access area. The result is a substantially rectangular or elliptical patient access opening with horizontal dimensions defined by the x, z coils sets and vertical dimensions defined by the y coil set.

23 Claims, 3 Drawing Sheets

PATIENT ACCESS AREA BOUNDARY

MAGNETIC GRADIENT COIL SET FOR NUCLEAR MAGNETIC RESONACE SYSTEM HAVING SUBSTANTIALLY DIFFERENT COIL-PATIENT SPACINGS

This invention relates generally to the art of magnetic resonance systems utilizing nuclear magnetic resonance (NMR) phenomena. It is more particularly directed to the electromagnetic coil structure used in such a system for creating transverse magnetic gradients in a static magnetic field directed along a predetermined z-axis. Magnetic resonance imaging (MRI) and/or whole body localized spectroscopy are among the possible advantageous uses for such a coil structure.

Magnetic resonance imaging systems are now commercially available from a number of sources. There are, in general, several techniques known to those in the art. Some exemplary techniques are set forth, for example, in commonly assigned issued U.S. Pat. Nos. 4,297,637; 4,318,043; 4,471,305 and 4,599,565.

In most such MRI systems, a static magnetic field $H_o$ (e.g., created by a super-conducting solenoid maintained in a cryogenic housing) is directed along a predetermined z-axis. In one exemplary embodiment, the static field may have a nominal field strength of approximately 3.5 Kilogauss thus making hydrogen nuclei exhibit NMR at approximately 15 MHz frequency. The usual mutually orthogonal x,y,z coordinate system is assumed and auxiliary x,y,z gradient coils are disposed within the static magnetic field so as to generate gradients therein along the x,y and z directions respectively when appropriate driving currents are passed therethrough. As will be appreciated, the x and Y gradient coils each give rise to so-called transverse gradients (i.e., gradients in the static magnetic field along directions orthogonal to the z-axis direction of that field). And, typically, the x and y transverse gradient coil structures are substantially identical except for a 90° rotation with respect to each other. Such typical prior art gradient coil structures are depicted, for example, in FIG. 1 herein and in commonly assigned copending application Serial No. 19,631 filed Feb. 27, 1987.

In many MRI techniques, it is necessary to rapidly switch on/off (and sometimes to different precisely predetermined amplitudes) currents passing through these various gradient coils. Accordingly, the rapidity with which such switching operations can be achieved may constitute one determining factor in the overall speed of an entire MRI imaging sequence. Since permissible coil switching speed is primarily a function of coil inductance, it follows that if one can somehow reduce the self-inductance of the transverse gradient coils (or even one of them), then faster magnetic gradient switching sequences may be realized.

It is also typically necessary to pass many amperes of current through many turns of the gradient coils to achieve the required gradient magnitude. Accordingly, a considerable cost is involved in providing sufficient current drive sources (e.g., power amplifiers and power switches, etc., capable of handling the required current levels) as well as in dissipation of $I^2R$ losses in the coils and associated driving circuitry. Accordingly, design techniques which tend to reduce the required gradient coil drive currents (for given gradient levels) are highly desirable.

Some other prior approaches to magnetic coil design for NMR devices may be found at:

U.S. Pat. No. 3,569,823-Golay (1971)
U.S. Pat. No. 3,622,869-Golay (1971)
U.S. Pat. No. 4,456,881-Compton (1984)
"Magnetic Field Profiling: Analysis and Correcting Coil Design" by F. Romeo and D. I. Hoult, Mag. Res. in Medicine, 1 44–65 (1984).

A commonly assigned pending U.S. patent application Ser. No. 19,631 to Carlson, filed Feb. 27, 1987, explains how a shortened and thus more compact set of gradient coils may be realized with respect to z-axis dimensions. Such techniques may, in the preferred embodiment, also be used in conjunction with the present invention (which deals with changes to the cross-sectional dimensions of such coils along plane perpendicular to the z-axis).

As will be appreciated by those in the art and by reference to gradient coil designs such as those referenced above, prior gradient coil designs have generally resulted in the x,y, and z gradient coil sets all having approximately the same diameter and all being approximately centered about the z-axis along the center of a generally circular patient access space. While there have, of course, been differences in the diameter of the various x,y and z coil sets necessitated by the physical impossibility of having the same space occupied simultaneously by all three coils (and also because of the necessity for including electrical insulation between the various windings of a given coil and those of other coils), the resulting x,y,z coil set structures have generally been closely adjacent and of approximately similar diameters and spacing from the center of the patient access area.

However, we have discovered that it is not necessary to maintain such attempted symmetry of gradient coil spacings from the patient. Instead, as we have discovered, it is possible to achieve improved MRI by permitting at least one of the coil sets (e.g., the y gradient coil set) to be positioned much closer to a patient's body than the remaining gradient coil set(s). Similar improvements in other NMR applications are expected.

By making at least one of the gradient coil sets fit closer to the patient's body (e.g., to the body access space), stronger gradient fields are generated within the patient's body for a given electrical current through that coil set. Accordingly, one may choose to make the coil set somewhat smaller, or to use less driving current or to obtain higher MRI image resolution (i.e., as may be made possible by a stronger transverse y gradient field) or to achieve faster switching as may be especially desirable in certain types of MRI imaging sequences, such as echo planar imaging (i.e., because one may make the y gradient coils of reduced self-inductance). As will be appreciated, the designer of a particular MRI system may choose to maximize one or the other of these possible advantages of our novel gradient coil arrangement.

In one exemplary embodiment, an approximately rectangular (e.g. a horizontal "keyhole", or oval or elliptical) patient access opening is maintained with vertical dimensions at the center on the order of about 14 inches. Thus, a 12 inch diameter r.f. "head coil" can still be accommodated within the patient access opening. Other conventional r.f. coil structures can also be accommodated even though the patient access area is considerably reduced in its vertical dimensions. For example, a generally circular r.f. transmit coil may be disposed *outside* the entire gradient coil set with smaller surface r.f. coils being used within the patient access area adjacent the patient area to be imaged and used for receiving r.f. NMR signals from within the patient's body. These techniques are now well-known in the art and often provide improved signal-to-noise ratios as well as a somewhat smaller field of view for special imaging purposes (e.g., for heart studies or the like).

As those in the art will appreciate, there is an audible sound created by the gradient coil driving currents when they are switched at audio frequencies (e.g., due to the unavoidable interaction between the magnetic field created by the pulsed currents traveling through the gradient coils, the existing static field and the mechanical forces thereby set up which cause the physical structure of the gradient coil set to move and act as a sort of loud speaker cone). Since our new design makes it possible to achieve somewhat smaller coil structures and/or higher frequencies of gradient coil switching and/or permits the use of lower levels of gradient coil currents for given field strengths, the possibly annoying audible sounds typically associated with an ongoing MRI sequence may possibly be somewhat reduced.

In one exemplary embodiment, an assembly of magnetic gradient coils is used within an MRI system to create controlled three-dimensional gradients along x,y,z axes in a superimposed static magnetic field directed along the z-axis. The x and z gradient coil segments are centered about the z-axis at approximately similar radii. However, the y gradient coil segments are centered about axes that are off-set from and parallel to the z-axis so as to cause a major portion of the y gradient coil set to be disposed closer to the center of the patient access area than are the other coil sets.

In brief, the x, z gradient coil sets are disposed at a first minimum distance from the z-axis while the y gradient coil segments are disposed at a second minimum distance from the z-axis with the second distance being substantially less than the first distance. Where the x and y gradient coil sets are disposed orthogonally with respect to one another in this manner, they effectively define a patient access opening which extends along the z-axis and which has a generally rectangular (or oval or elliptical) cross-sectional shape of the size which corresponds to such different first and second minimum distances.

Figure 2:
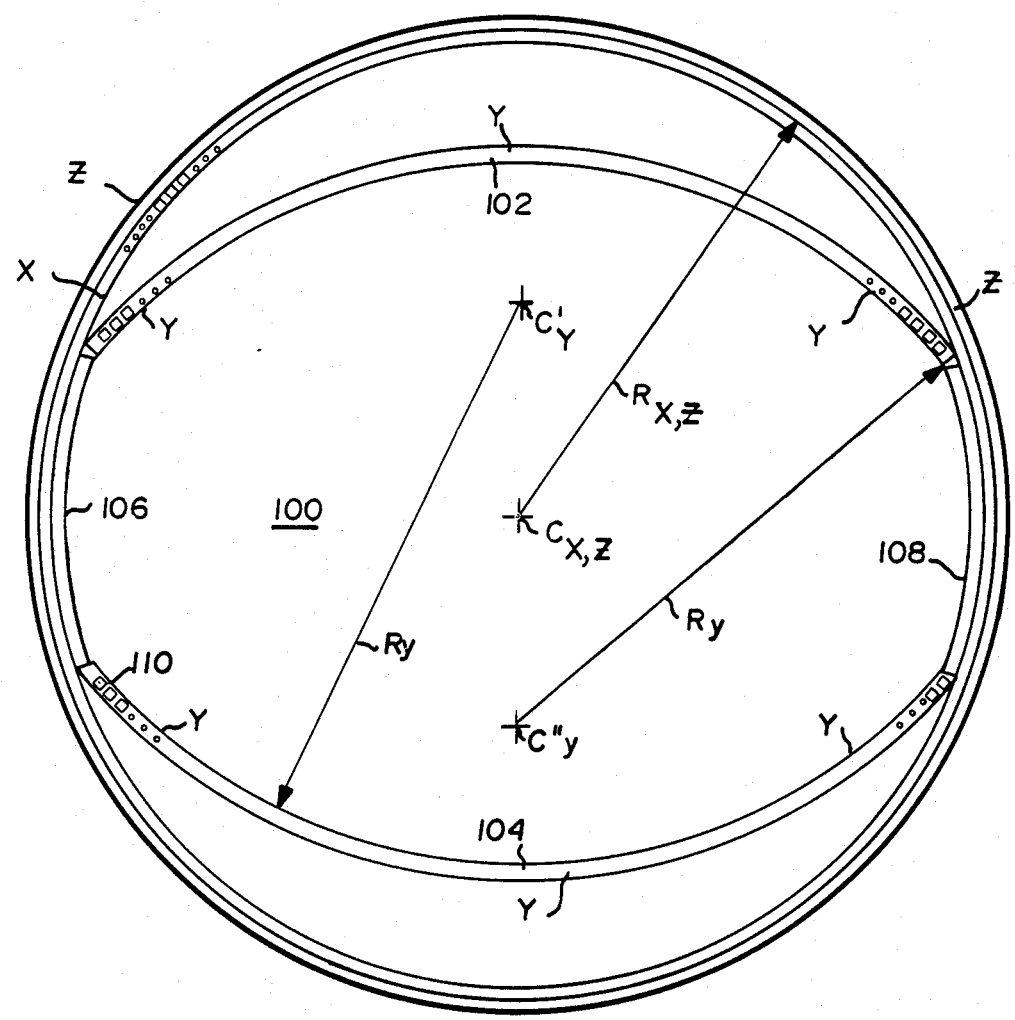
Figure 3:
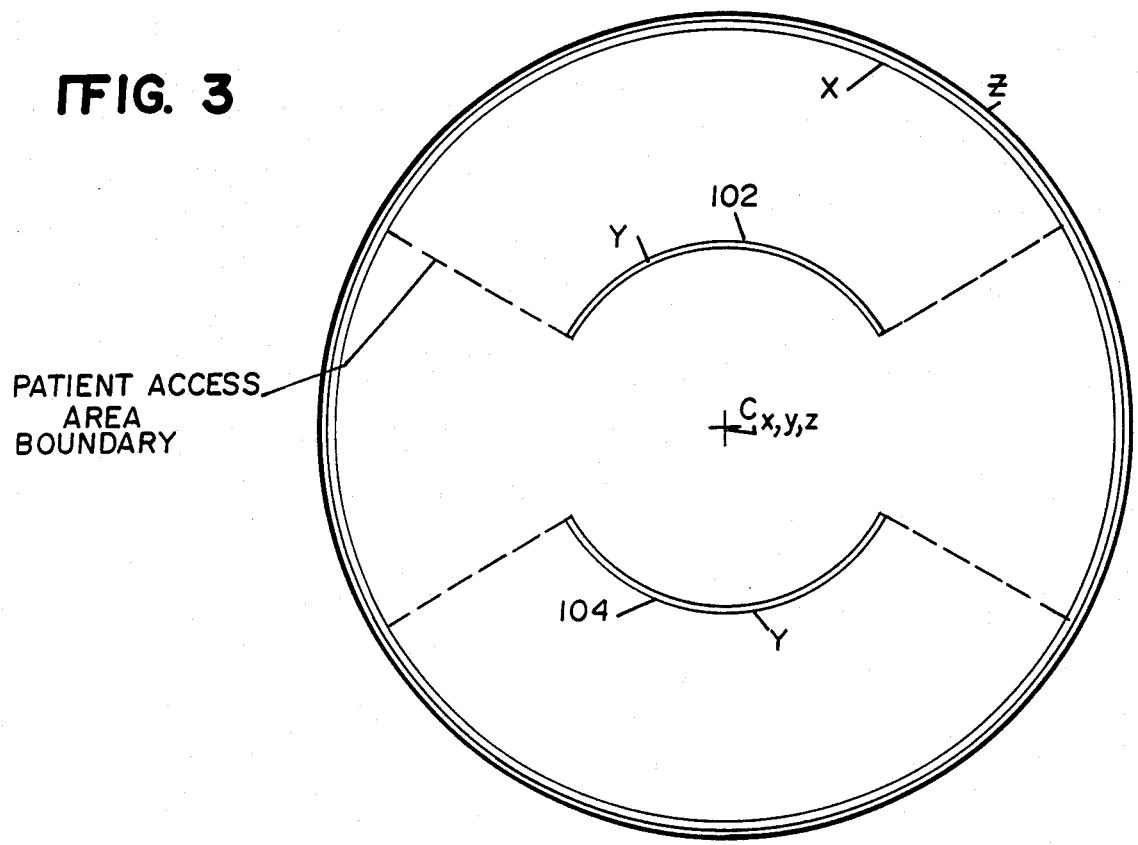
Figure 4:
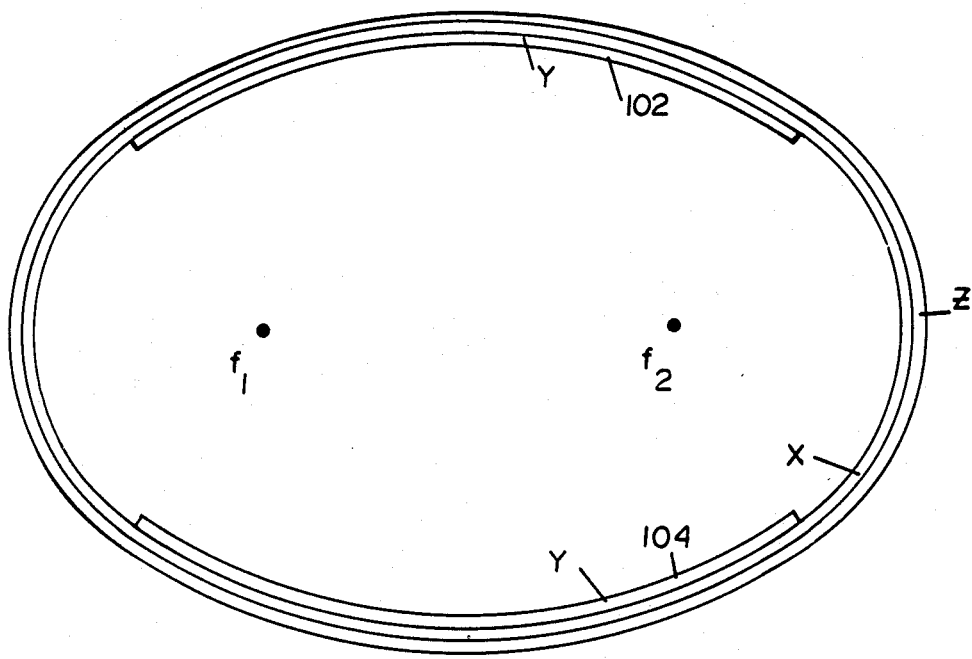

These as well as other objects and advantages of this invention will be more completely understood and appreciated by careful study of the following detailed description of a presently preferred exemplary embodiment with reference to the accompanying drawings in which:

FIG. 1 represents an exploded perspective view of the x,y,z gradient coils in a typical prior art MRI system;

FIG. 2 schematically depicts a cross-sectional view of an assembled x,y,z gradient coil set constructed in accordance with this invention;

FIG. 3 schematically depicts a cross-sectional view of another exemplary embodiment; and FIG. 4. schematically depicts a cross-sectional view of yet another exemplary embodiment.

A typical prior art MRI system is depicted at FIG. 1. Here, a static field magnetic coil 10 (e.g., a super-conductive coil) is housed within a housing 12 (e.g., cryogenic) so as to create a static field $H_o$ directed along the z-axis (which typically coincides with the axis of cylindrical structures 10, 12). The x, y and z gradient coils are conformed to cylindrical shapes, disposed centrally within structures 10, 12 and driven with suitable pulses of electrical current so as to cause gradients in the static field $H_o$ along the x,y and z coordinates. One typical prior art design for the transverse x,y gradient coils are so-called "saddle" coils having eight arcuate coil segments disposed in accordance with the so-called "Golay" or other similar conditions designed to maximize linearity of the transverse gradients produced by such coil structures. Typically, the x and y gradient coils are substantially identical except for a relative rotation of 90°. And, as previously noted, insofar as possible, the x,y,z gradient coils have typically all employed circular arcs centered about the z-axis and having approximately equal radii (with slight differences as necessary to accommodate necessary coil insulation and/or the co-location of other ones of the gradient coils).

One or more radio frequency coils are also used to couple r.f. energy into a patient and to couple NMR r.f. responses away from the patient. The x,y,z gradient coils and the r.f. coil(s) are interconnected with conventional MRI drive and control circuits 14 to complete an MRI imaging system which produces a final MRI image at a video display 16. A patient 18 carried by a suitable structure 20 may be passed into the patient access area along the z-axis and within the nested structure of x,y,z gradient coils and r.f. coil(s).

An exemplary (e.g. for pediatric uses) x,y,z gradient coil assembly in accordance with this invention is schematically shown in cross section at FIG. 2. The scale is approximately 1:3. However, the depiction of individual conductors within a gradient coil is not to scale and is purely schematic. Actual individual conductor placements are in accordance with conventional Golay or other conditions designed to achieve substantially linear transverse gradient fields within an area to be imaged—and the saddle coils for the x-coils are physically orthogonal to those of the y-coils (i.e. rotated by approximately 90 degrees about the z-axis). As those in the art will appreciate, for any given geometry and NMR application, one may conventionally computer simulate the magnetic fields produced by a given conductor placement and then iteratively seek the conductor placements which optimize a desired parameter (e.g., homogeneity).

As can be seen, the x and z gradient coil sets are formed at approximately the same radius $R_{x,z}$ and centered about the center of a patient access area 100 at $C_{x,z}$. However, the y gradient coil set is formed of a different radius $R_y$ with the top-most arc 102 being centered about an offset (vertically lower) center $C''_y$ while the lower arc 104 of the y gradient coil is of a similar radius $R_y$ centered about another offset (vertically higher) center $C'_y$ within the patient access area 100. Although the x-gradient saddle coils fall within the circular arc depicted in FIG. 2, those in the art will appreciate that the actual conductors are grouped and spaced so as to define the usual saddle coils which occupy only a portion of the available 360° and produce the desired x-gradient magnetic fields which are orthogonal to the y-gradient fields.

As a result, it can be seen that much of the y gradient coil segments 102, 104 are disposed considerably closer to the center $C_{x,z}$ of the patient access area 100 than are the x,z gradient coils. It can also be seen that the patient access area 100, in cross section, has a generally rectangular or oval or elliptical shape with the vertical dimensions being defined by the y gradient coil segments 102, 104 and the horizontal dimensions being defined by the support segments 106, 108 located adjacent the x,z coil arcs.

A few of the individual coil windings 110 have been schematically depicted in cross section at FIG. 2—albeit no attempt has been made to show actual conductor locations. (Since the z-gradient coil is typically solenoidal, no conductor cross section is depicted for this coil with windings that run parallel to the plane of FIG. 2.) In the exemplary embodiment, these are formed of square copper conductors (approximately 0.1 inch square). Such conductors typically may be insulated by 0.05 inch insulative spacing between conductor edges. Such insulation may be realized by a combination of enamel or glass tape and potting within a substantial rigid reinforced fibre glass structure such as those commonly now used in the art. As will be appreciated, the details of coil design (number of turns, spacing between turns, coil radii and placement) are customized to a particular desired MRI installation. However, in one exemplary embodiment having the approximate cross-sectional dimensions depicted in FIG. 2 (at a 1:3 scale), the maximum vertical dimension of the patient access area 100 is approximately 14 inches so as to accommodate a 12 inch diameter radio frequency head coil. In that same exemplary embodiment, the x and y coils each comprise 25 turns of 0.1 inch square copper conductor with windings being approximately equally spaced (0.05 inch between conductors) and distributed while the z coil comprises approximately 16 turns of the same type of conductor. Viewed from the side or top, each saddle coil section (4 for the x-coil set and 4 for the y-coil set) comprises 25 turns arranged about the outer boundary of a rectangular area which is conformed to the desired arcuate shape and position. In one embodiment, the maximum z-axis length of each x-coil saddle segment is 16.00 inches and that of each y-coil saddle segment is 15.75 inches. In the same embodiment, the inner edge of the x-coil segments is spaced 2.09 inches from the center line of the image area and the inner edge of the y-coil segments is spaced 1.23 inch therefrom.

In the exemplary embodiment of FIG. 2, the x and z gradient coil segments are thus centered about the z axis at $C_{x,z}$ while the y gradient coil segments 102, 104 are centered about axes $C''_y$ and $C'_y$ respectively that are offset from and parallel to the z-axis (which z-axis is perpendicular to FIG. 2 and coincident with $C_{x,z}$). Accordingly, while the x,z coil segments are disposed at a first minimum distance (e.g., radius $R_{x,z}$) from the z-axis, the y gradient coil segments are disposed at a second minimum distance from the z-axis which is substantially less than that of the x,z gradient coil segments. Furthermore, because the x,y coil segments are disposed orthogonally with respect to one another, they define a patient access opening 100 which extends along the z-axis and has a generally rectangular (or oval or elliptical) cross-sectional shape with the size corresponding to such different first and second minimum distances. In the exemplary embodiment, the patient access opening 100 has a cross-sectional area which extends horizontally between circular arcs centered on the z-axis and vertically between circular arcs of a larger radius centered on respective axes which are offset above and below the z-axis.

Another exemplary embodiment is shown in FIG. 3. Here like reference numerals are used to depict like elements. However, the y-gradient coil arcs are now of lesser extent so as to define a still generally rectangular patient access area 100 which might also be called a (horizontal) "key-hole" shape in cross section (with a suitable physical space boundary interposed between the y and x coil segments as depicted by dotted lines).

Although the fields produced by an elliptical coil arc are more difficult to analyze (than those of a circular coil arc), such an arrangement may also be advantageous in permitting the y-gradient coils to be more closely positioned to the patient's body. Such an embodiment is depicted in FIG. 4 where the x,y,z coil segments are all essentially co-located at an elliptical boundary of the patient access area 100 having foci $f_1$ and $f_2$. As should be apparent, the x-gradient coil conductors may be disposed in the usual saddle coil configuration within the elliptical x-coil arc orthogonally to the conductors in the elliptical y-coil arc (which latter conductors provide the y-gradient coils). A combination of circular, elliptical or other shaped arcs could also be used for the cross sectional shape of one or more of the gradient coils as should now be apparent.

While only a few exemplary embodiments of this invention have been explained in detail, those skilled in the art will recognize that many variations and modifications may be made in such exemplary embodiments while yet retaining many of the novel features and advantages of this invention. Accordingly, all such variations and modifications are intended to be included within the scope of the appended claims.

What is claimed is:

1. An assembly of magnetic gradient coils for use in creating controlled three-dimensional magnetic field gradients along mutually orthogonal x, y, z axes in a magnetic resonance system having a static magnetic field directed along the z-axis in which static field said gradients are created during passage of electrical current in said gradient coils, said assembly comprising:
   x and z gradient coils having gradient-generating segments centered about said z-axis for generating magnetic gradients along respectively corresponding mutually orthogonal x and z axis directions within an enclosed patient access volume; and
   a y gradient coil also encompassing said patient access volume but having gradient-generating segments centered about an axis that is offset from and parallel to said z-axis for generating a magnetic gradient along a y axis direction mutually orthogonal to said x and z axes.

2. An assembly of magnetic gradient coils for use in creating controlled three-dimensional magnetic field gradients in a magnetic resonance system having a static magnetic field directed along a z-axis in which static field said gradients are created during passage of electrical current in said gradient coils, said assembly comprising:
   at least a first gradient coil having gradient-generating segments disposed at a first minimum distance from said z-axis; and
   at least a second gradient coil having gradient-generating segments disposed at a second minimum distance from said z-axis, said second distance being substantially less than said first distance.

3. An assembly as in claim 2 wherein the segments of said first coil are disposed with respect to those of said second coil so as to define a patient access opening extending along the z-axis which has a generally rectangular cross-sectional shape and which has a size corresponding to said different first and second minimum distances.

4. An assembly as in claim 2 wherein said patient access opening has a cross section which extends horizontally between circular arcs centered on said z-axis and vertically between circular arcs centered on respective axes which are offset above and below said z-axis.

5. An assembly as in claim 2 wherein said patient access opening has an elliptical cross section.

6. An assembly as in claim 2 wherein said patient access opening has a key-hole shaped cross section which extends horizontally between circular arcs centered on said z-axis and vertically between circular arcs of substantially smaller diameter also centered on said z-axis.

7. Magnetic gradient coils for a magnetic resonance system having mutually orthogonal x,y,z axes said gradient coils comprising:
 a z-axis gradient coil having coil segments disposed for creating a gradient along said z-axis in a static magnetic field directed along said z-axis;
 an x-axis gradient coil having coil segments disposed for creating a gradient along said x-axis in said static magnetic field;
 a y-axis gradient coil having coil segments disposed for creating a gradient along said y-axis in said static magnetic field;
 at least some of said y-axis coil segments being disposed substantially closer to said z-axis than are said x-axis coil segments.

8. Magnetic gradient coils as in claim 7 wherein the coil segments are arcuate and where the y-axis coil segments are centered on axes offset from said z-axis while the x and z axis coil segments are centered on the z-axis.

9. Magnetic gradient coils as in claim 7 which are disposed to define a patient access opening there within which extends along the z-axis and which has a cross section that is of generally rectangular configuration.

10. Magnetic gradient coils as in claim 9 wherein said patient access cross section is defined in horizontal dimension by a first pair of separated arcs and in a smaller vertical dimension by a second pair of separated arcs.

11. An assembly of magnetic gradient coils for use in creating controlled three-dimensional magnetic field gradients along x,y,z axes in a magnetic resonance imaging system having a static magnetic field directed along the z-axis in which static field said gradients are created during passage of electrical current in said gradient coils, said assembly comprising:
 at least some coil conductors of said gradient coils being disposed substantially closer to said z-axis than are others and defining a patient access space therewithin along the z-axis which has a cross section perpendicular to the z-axis with horizontal dimensions which are substantially greater than its vertical dimensions.

12. A magnetic resonance imaging system having an assembly of magnetic gradient coils as in claim 1, 2, 3, 4, 5, 6, 7, 8, 9, 10 or 11 which is disposed within a static magnetic field generating structure and electrically connected to MRI drive and control circuit means for passing a predetermined sequence of current pulses through said gradient coils during an MRI imaging sequence.

13. An assembly of magnetic gradient coils for use in creating controlled three-dimensional magnetic field gradients along x,y,z axes in a magnetic resonance system having a static magnetic field directed along the z-axis in which static field said gradients are created during passage of electrical current in said gradient coils, said assembly comprising:
 x and z gradient coils having respectively associated gradient-generating segments located at approximately equal distances from said z-axis; and
 a y gradient coil having gradient generating segments located substantially closer to said z-axis then are said x and z-gradient coil segments.

14. An assembly of magnetic gradient coils for use in creating controlled three-dimensional magnetic field gradients in a magnetic resonance system having a static magnetic field directed along the z-axis in which static field said gradients are created during passage of electrical current in said gradient coils, said assembly comprising:
 at least a first coil having gradient-generating segments disposed at a first minimum distance from said z-axis;
 at least a second coil having gradient-generating segments disposed at a second minimum distance from said z-axis, said second distance being substantially less than said first distance,
 said segments of the first and second coils being disposed to define a generally rectangular patient access opening along said z-axis.

15. An assembly as in claim 14 wherein said patient access opening has a keyhole configuration formed by pairs of opposing arcs of different dimensions.

16. An assembly as in claim 14 wherein at least one of said coils is of elliptical shape.

17. An assembly as in claim 14 wherein one of said coil segments is disposed orthogonally with respect to another of said coil segments so as to define a patient access opening extending along the z-axis which has a generally rectangular cross-sectional shape and which has a size corresponding to said different first and second minimum distances.

18. An assembly as in claim 14 wherein said patient access opening has a cross section which extends horizontally between circular arcs centered on said z-axis and vertically between circular arcs centered on respective axes which are offset above and below said z-axis.

19. Magnetic gradient coils for a magnetic resonance imaging system having mutually orthogonal x,y,z axes said gradient coils comprising:
 a z-axis gradient coil having coil segments disposed for creating a gradient along said z-axis in a static magnetic field directed along said z-axis;
 an x-axis gradient coil having coil segments disposed for creating a gradient along said x-axis in said static magnetic field;
 a y-axis gradient coil having coil segments disposed for creating a gradient along said y-axis in said static magnetic field;
 at least some of said y-axis coil segments being disposed substantially closer to said z-axis than are said x-axis coil segments.

20. Magnetic gradient coils as in claim 19 wherein the coil segments are arcuate and where the y-axis coil segments are centered on axes offset from said z-axis while the x and z axis coil segments are centered on the z-axis.

21. Magnetic gradient coils as in claim 19 which are disposed to define a patient access opening there within which extends along the z-axis and which has a cross section that is of generally rectangular configuration.

22. Magnetic gradient coils as in claim 21 wherein said patient access cross section is defined in horizontal dimension by a first pair of separated arcs and in a smaller vertical dimension by a second pair of separated arcs.

23. An assembly of plural magnetic gradient coils for use in creating controlled three-dimensional magnetic field gradients along x,y,z axes in a magnetic resonance system having a static magnetic field directed along the z-axis in which static field said gradients are created during passage of electrical current in said gradient coils, said coils being characterized by:
  at least one of said coils having a non-circular cross section to define, at least in part, a non-circular patient access opening therewithin extending along said z-axis.

* * * * *